US012745604B2

(12) United States Patent
Cong et al.

(10) Patent No.: US 12,745,604 B2
(45) Date of Patent: Sep. 22, 2026

(54) IN SITU FILM GROWTH SENSOR ASSEMBLY, APPARATUS, AND METHODS

(71) Applicant: Applied Materials, Inc., Santa Clara, CA (US)

(72) Inventors: Zhepeng Cong, San Jose, CA (US); Tao Sheng, Santa Clara, CA (US); Xinning Luan, Tempe, AZ (US); Enle Choo, Saratoga, CA (US); Ala Moradian, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 695 days.

(21) Appl. No.: 17/745,361

(22) Filed: May 16, 2022

(65) Prior Publication Data

US 2022/0375800 A1 Nov. 24, 2022

Related U.S. Application Data

(60) Provisional application No. 63/190,898, filed on May 20, 2021.

(51) Int. Cl.

*H01L 21/66* (2006.01)
*H01L 21/67* (2006.01)
*H10P 72/00* (2026.01)
*H10P 74/20* (2026.01)

(52) U.S. Cl.

CPC ........ *H10P 74/203* (2026.01); *H10P 72/0404* (2026.01); *H10P 72/0604* (2026.01)

(58) Field of Classification Search

CPC .......................... H01L 21/67253; H01L 22/12

See application file for complete search history.

(56) References Cited

U.S. PATENT DOCUMENTS 4,203,799 A 5/1980 Sugawara et al.
4,582,431 A 4/1986 Cole
4,812,650 A 3/1989 Eckstein et al.
5,046,849 A * 9/1991 Severin .............. G01B 11/0675 356/504

(Continued)

FOREIGN PATENT DOCUMENTS

CN 107587122 A 1/2018
JP S6423103 A 1/1989

(Continued)

OTHER PUBLICATIONS

International Search Report and Written Opinion dated Aug. 31, 2022 for Application No. PCT/US2022/029416.

(Continued)

*Primary Examiner* — Parviz Hassanzadeh
*Assistant Examiner* — Nathan K Ford
(74) *Attorney, Agent, or Firm* — Patterson + Sheridan, LLP

(57) ABSTRACT

Embodiments disclosed herein generally relate to in situ monitoring of film growth in processing chambers. In some examples, a sensor assembly for a processing chamber includes a sensor tube including silicon carbide and having an optical path therein and a sensor window including crystalline silicon carbide and having a proximal side coupled to a distal end of the sensor tube. The sensor window covers the optical path, and a distal side of the sensor window facing away from the proximal side is perpendicular to a center axis of the optical path.

17 Claims, 7 Drawing Sheets

(56) References Cited

U.S. PATENT DOCUMENTS

| | | | | |
|---|---|---|---|---|
| 5,277,496 | A * | 1/1994 | Mayer | G01J 5/0821 374/208 |
| 5,549,756 | A | 8/1996 | Sorensen et al. | |
| 6,200,634 | B1 | 3/2001 | Johnsgard et al. | |
| 6,734,969 | B2 * | 5/2004 | Abraham | H01L 21/67253 356/369 |
| 8,822,248 | B2 | 9/2014 | Park | |
| 10,134,569 | B1 | 11/2018 | Albarede et al. | |
| 2004/0237888 | A1 | 12/2004 | Codella et al. | |
| 2006/0185588 | A1 | 8/2006 | Nozawa et al. | |
| 2009/0272719 | A1 | 11/2009 | Collins et al. | |
| 2013/0193131 | A1 | 8/2013 | Hur et al. | |
| 2015/0085349 | A1 * | 3/2015 | Chen | G02F 1/3551 359/326 |
| 2018/0010243 | A1 | 1/2018 | Lee et al. | |
| 2019/0187003 | A1 * | 6/2019 | Brunnett | G01K 1/10 |
| 2020/0321201 | A1 | 10/2020 | Lin et al. | |

FOREIGN PATENT DOCUMENTS

| | | | |
|---|---|---|---|
| JP | H8191049 | A | 7/1996 |
| JP | 200335512 | A | 2/2003 |
| JP | 201537134 | A | 2/2015 |
| KR | 20020000503 | A | 1/2002 |
| KR | 20080039251 | A | 5/2008 |
| KR | 20090072702 | A | 7/2009 |
| KR | 20170028906 | A | 3/2017 |
| WO | 2004102307 | A2 | 11/2004 |
| WO | 2005071134 | A1 | 8/2005 |
| WO | 2020142451 | A1 | 7/2020 |
| WO | 2020210115 | A1 | 10/2020 |

OTHER PUBLICATIONS

Japanese Office Action dated Sep. 3, 2024 for Application No. 2023-544360.

Korean Office Action dated Oct. 31, 2024 for Application No. 10-2023-7024896.

Springthorpe, A. J., et al., “In situ growth rate measurements during molecular beam epitaxy using an optical byrometer”, Applied Physics Letters, Jun. 4, 1998, https://aip.scitation.org/doi/pdf/10.1063/1.102082, Last accessed Mar. 16, 2021.

International Search Report and Written Opinion dated May 2, 2022 for Application No. PCT/US2022/013259.

Korean Office Action dated Jul. 7, 2025 for Application No. 10-2023-7024896.

Singapore Office Action dated Aug. 1, 2025 for Application No. 11202305496P.

Taiwan Office Action dated Jul. 9, 2025 for Application No. 111118497.

Extended European Search Report dated Jul. 28, 2025 for Application No. 22805250.2.

Korean Office Action dated Jul. 29, 2025 for Application No. 10-2023-7024896.

Chinese Office Action for Application No. 202280016431.X dated Apr. 16, 2026.

* cited by examiner 300
102
104
106
107
111
113
138
148a
148b
144
140
142
170
150
152
154
109
108
126
134
128
101
114
312
132
362b
362
361
360
364
363
333
124
110
136
118
382
122
174
384
365a
365b
366
367
368
369
151
120
115
339
116
130
172

IN SITU FILM GROWTH SENSOR ASSEMBLY, APPARATUS, AND METHODS

CROSS-REFERENCE TO RELATED APPLICATION

This application claims the benefit of U.S. provisional patent application Ser. No. 63/190,898, filed May 20, 2021, which is herein incorporated by reference in its entirety.

BACKGROUND

Field

Embodiments of the present disclosure generally relate to in situ monitoring of film growth in processing chambers. More particularly, embodiments disclosed herein relate to sensor assemblies for epitaxial chambers and methods of use thereof for monitoring epitaxial film thickness growth.

Description of the Related Art

Semiconductor substrates are processed for a wide variety of applications, including the fabrication of integrated devices and micro-devices. One method of substrate processing includes depositing a material, such as a dielectric material or a conductive metal, on an upper surface of the substrate in a processing chamber. For example, epitaxy is a deposition process that grows a thin, ultra-pure layer, usually of silicon or germanium on a surface of a substrate. The material may be deposited in a lateral flow chamber by flowing a process gas parallel to the surface of a substrate positioned on a support and thermally decomposing the process gas to deposit a material from the process gas onto the substrate surface.

Film thickness measurements of a processed substrate may be used in relation to processing operations. The film thickness measurements may be taken outside of a process chamber in which the processed substrate is processed, after the processing operations are conducted (e.g., offline). Offline measurements may involve inefficiencies and reduced throughput as substrates which do not meet specifications may not be used, and it can take several processing iterations to obtain measurements that meet specifications.

Additionally, it is difficult to conduct film thickness measurements within the process chamber and during the processing operations because processing equipment in the process chamber may interfere with measurement equipment, thereby hindering measurement accuracy. For example, infrared lamp radiation and heat emitted from the lamps can interfere with measurement equipment.

Therefore, there is a need for improved apparatus and methods for in situ measurement of film thickness in processing chambers.

SUMMARY

Implementations of the present disclosure generally relate to in situ monitoring of film growth in processing chambers. More particularly, embodiments disclosed herein relate to sensor assemblies for epitaxial chambers and methods of use thereof, and related apparatus.

In one implementation, a sensor assembly for a processing chamber suitable for use in semiconductor manufacturing includes a sensor tube including silicon carbide and having an optical path therein and a sensor window including crystalline silicon carbide and having a proximal side coupled to a distal end of the sensor tube. The sensor window covers the optical path, and a distal side of the sensor window facing away from the proximal side is perpendicular to a center axis of the optical path.

In one implementation, a processing chamber suitable for use in semiconductor manufacturing includes a chamber body having an upper window, a lower window, and a side wall defining a processing region. The processing chamber includes a process gas inlet formed through the side wall, a susceptor disposed in the processing region and having a substrate-receiving top surface, and a pre-heat ring surrounding the susceptor. The processing chamber includes a rotatable shaft supporting the susceptor and a sensor assembly. The sensor assembly includes a sensor tube comprising silicon carbide and having an optical path therein and a sensor window comprising crystalline silicon carbide and having a proximal side coupled to a distal end of the sensor tube. The sensor window covers the optical path, and a distal side of the sensor window is exposed to the processing region.

In one implementation, a computer readable medium is provided which stores instructions, that, when executed by a processor of a system suitable for use in semiconductor manufacturing, cause the system to deposit a film simultaneously on a substrate and on a crystalline sensor window disposed within a processing chamber; absorb infrared radiation with a sensor tube coupled to the crystalline sensor window to heat the crystalline sensor window at least in part through the sensor tube; measure an intensity of light reflected by or transmitted through the sensor window using an optical spectrometer; and determine at least one of a thickness or growth rate of the film deposited on the crystalline sensor window based on the measured light intensity.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to in situ monitoring of film growth in processing chambers. As an example, embodiments disclosed herein provide apparatus and methods for in situ monitoring of film growth and measurement of film thickness in processing chambers (e.g., epitaxial chambers).

Embodiments disclosed herein provide a sensor window positioned in the processing chamber in such a way as to receive epitaxial film growth thereon which simulates the epitaxial film growth occurring simultaneously on a substrate positioned in the processing chamber.

Embodiments disclosed herein provide a sensor window constructed and arranged to have a temperature similar to a substrate being processed in the processing chamber to simulate the film deposition characteristics of the substrate.

Embodiments disclosed herein provide a sensor window having a composition which enables backside spectral wavelength measurements in either reflection mode, transmission mode, or both of the reflection mode and the transmission mode.

Embodiments disclosed herein provide a sensor assembly which enables spectral reflectivity measurements irrespective of strong optical background radiation and resulting low signal-to-noise ratio characteristics of epitaxial chambers. The noise can involve, for example, noise resulting from infrared lamp radiation in the epitaxial chambers). Sensor assembly embodiments described herein provide a sensor tube with a reflectometer light path therein which is sealed from stray infrared radiation. Sensor assembly embodiments described herein provide a sensor tube which absorbs infrared lamp radiation and subsequently conducts thermal energy from the sensor tube to a sensor window coupled thereto in order to increase a temperature of the sensor window, thereby advantageously raising a temperature of the sensor window towards a temperature of a substrate being processed. Sensor assembly embodiments described herein provide an optical path which is isolated from process gas flow.

Embodiments disclosed herein provide a modulated optical source which can distinguish transmission mode wavelength measurements resulting from infrared lamp radiation. Embodiments disclosed herein provide a sensor window having a built-in band edge transmission property that can be used for sensor window temperature detection. Embodiments disclosed herein provide a sensor window which enables in situ conditioning (pre-loading) to improve sensor window sensitivity.

Figure 1A:
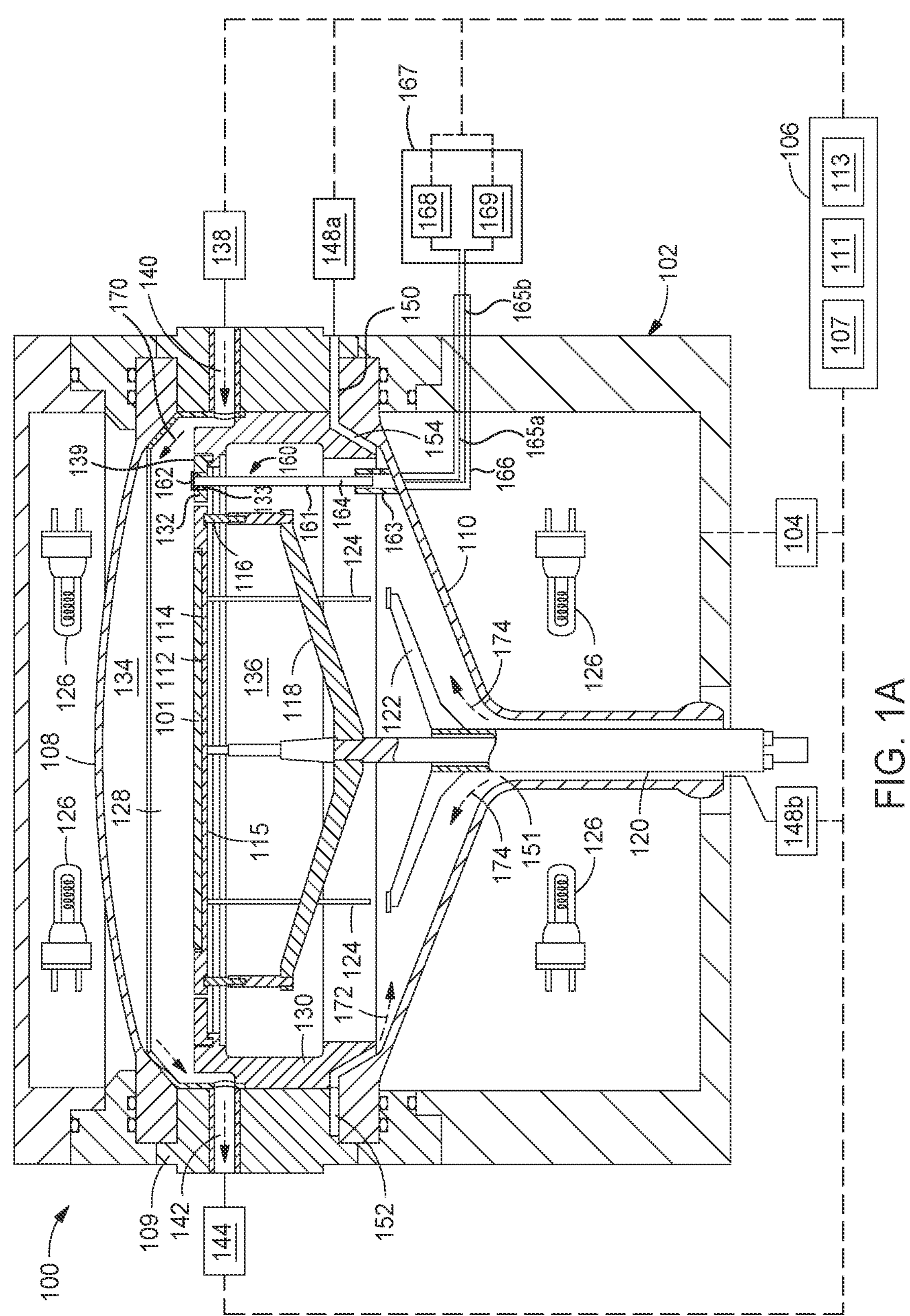
FIG. 1A is a schematic cross-sectional side view of a processing chamber, according to one implementation.

FIG. 1A is a schematic cross-sectional side view of a processing chamber 100, according to one implementation. The processing chamber 100 may be used to process one or more substrates 101, including the deposition of a material on an upper surface of the substrate 101. For example, the processing chamber 100 may be used to perform an epitaxial deposition process on the substrate 101 to epitaxially grow the material on the upper surface of the substrate 101. In one example, the processing chamber 100 may be configured to process a 300 mm substrate.

The processing chamber 100 generally includes a chamber body 102, support systems 104, and a controller 106. The support systems 104 may include components for monitoring and/or executing one or more processes performed using the processing chamber 100, such as film deposition. The controller 106, such as a programmable computer, is coupled to the support systems 104 and is adapted to control the processing chamber 100 and support systems 104. The controller 106 includes a programmable central processing unit (CPU) 107 which is operable with a memory 111 (e.g., non-volatile memory) and support circuits 113. The support circuits 113 are coupled to the CPU 107 and include cache, clock circuits, input/output circuitry and subsystems, power supplies, and the like, and combinations thereof coupled to the various components of the processing chamber 100.

In one or more embodiments, the CPU 107 is one of any form of general purpose computer processor used in an industrial setting, such as a programmable logic controller (PLC), for controlling various monitoring system component and sub-processors. The memory 111, coupled to the CPU 107, is non-transitory and is typically one or more of readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk drive, hard disk, flash drive, or any other form of digital storage, local or remote.

Herein, the memory 111 is in the form of a computer-readable storage media containing instructions (e.g., non-volatile memory), that when executed by the CPU 107, facilitates the operation of the processing chamber 100. The instructions in the memory 111 are in the form of a program product such as a program that implements the methods of the present disclosure (e.g., middleware application, equipment software application, etc.). The program code may conform to any one of a number of different programming languages. In one example, the disclosure may be implemented as a program product stored on computer-readable storage media for use with a computer system. The program (s) of the program product define functions and activities of the embodiments (including the methods, such as the method 400, described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions and activities of the methods described herein, are embodiments of the present disclosure.

The chamber body 102 has an upper window 108, e.g., an upper dome, a side wall 109, and a lower window 110, e.g., a lower dome, defining a processing region. A susceptor 112 used for supporting a substrate 101 is disposed in the processing region. The susceptor 112 may be formed from silicon carbide or graphite coated with silicon carbide. The susceptor 112 has a substrate-receiving top surface 114. The susceptor 112 is rotated and supported by support posts 116, which are coupled to respective supporting arms 118 that extend from a shaft 120. During operation, the substrate 101 disposed on the susceptor 112 may be raised relative to the susceptor 112 by substrate lift arms 122 through lift pins 124.

The internal volume of the processing chamber 100 is divided into an upper chamber volume 134 (e.g., a process gas region) above a plane of the susceptor 112 and a lower chamber volume 136 (e.g., a purge gas region) below the plane of the susceptor 112.

The processing chamber 100 includes an array of radiant heat lamps 126 for heating, among other components, the susceptor 112 (e.g., a back side 115 thereof) and a pre-heat ring 132. Heating of the susceptor 112 and pre-heat ring 132 contributes to thermal decomposition of process gases onto the substrate 101 to form one or more layers on the substrate 101. The radiant heat lamps 126 may be disposed above the upper window 108, below the lower window 110, or both, as shown in FIG. 1A. The upper window 108 and lower window 110 may be formed from an optically transparent material, such as quartz, to facilitate transmission of thermal radiation therethrough.

The radiant heat lamps 126 may be arranged in any desired manner around the susceptor 112 to independently control the temperature at various regions of the substrate 101 in order to facilitate the deposition of a material onto the upper surface of the substrate 101. While not discussed here in detail, the deposited material that is deposited on the substrate 101 may include one or more of silicon, silicon germanium, gallium arsenide, gallium nitride, and/or aluminum gallium nitride, among other materials. The thermal energy output of each of the radiant heat lamps 126 may be precisely controlled using the controller 106. The radiant heat lamps 126 may be configured to heat the interior of the processing chamber 100 to a temperature within a range of about 200° C. to about 1200° C.

A reflector may be optionally placed above the upper window 108 to reflect infrared light that is radiating off the substrate 101 back onto the substrate 101. The reflector may be fabricated from a metal such as aluminum or stainless steel. The efficiency of the reflection can be improved by coating a reflector area with a highly reflective coating such as with gold. The reflector may be coupled to a cooling source for providing a cooling fluid such as water to the reflector for cooling the reflector.

An upper liner 128 is disposed below the upper window 108 and is configured to reduce or prevent unwanted deposition onto chamber components, such as the sidewall 109 or a peripheral portion of the upper window 108. The upper liner 128 is positioned adjacent to a lower liner 130. The lower liner 130 is configured to fit inside an inner circumference of the sidewall 109. The lower liner 130 is disposed between the upper window 108 and lower window 110. The lower liner 130 radially outwardly surrounds the lower chamber volume 136. The upper liner 128 and lower liner 130 may be formed from quartz.

A pre-heat ring 132 is coupled to the lower liner 130 and extends radially inwardly therefrom. The pre-heat ring 132 is supported on a radially inwardly extending portion of the lower liner 130. The pre-heat ring 132 is configured to be disposed around the periphery of the susceptor 112 when the susceptor 112 is in a processing position as shown in FIG. 1A. In one or more examples, the pre-heat ring 132 is formed from silicon carbide, silicon carbide coated graphite, and/or black quartz. The temperature of the pre-heat ring 132 during operation may be within a range of about 100° C. to about 1,100° C. The heated pre-heat ring 132 helps to activate process gases flowing through the upper chamber volume 134. The pre-heat ring 132 can activate process gases prior to the process gases flowing over the upper surface of the substrate 101.

Process gas supplied from a process gas source 138 is introduced into the upper chamber volume 134 through a process gas inlet 140 formed through the sidewall 109. The process gas inlet 140 extends at least partially between the upper liner 128 and lower liner 130. The process gas inlet 140 is configured to direct the process gas in a generally radially inward direction as indicated by process gas flow 170. During film formation, the susceptor 112 may be located in a processing position (shown in FIG. 1A), which is adjacent to and at about the same elevation as (e.g., coplanar with) a terminus of the process gas inlet 140, which allows the process gas to flow in a generally planar, laminar condition along a flow path defined at least in part across an upper surface of the substrate 101. While only one process gas inlet 140 is shown, the process gas inlet 140 may include two or more inlets for delivering two or more individual process gas flows having different composition, concentration, partial pressure, density, and/or velocity.

The process gas exits the upper chamber volume 134 through an exhaust port, such as a process gas outlet 142, formed through the sidewall 109 of the processing chamber 102 opposite the process gas inlet 140. Exhaust of the process gas through the process gas outlet 142 is facilitated by a vacuum source, such as vacuum pump 144, fluidly coupled to a downstream side of the process gas outlet 142.

Purge gas is supplied from one or more purge gas sources 148*a* and/or 148*b* to the lower chamber volume 136. The purge gas sources 148*a* and 148*b* may be the same source or different sources as shown. The purge gas may be an inert gas, such as argon or nitrogen. The flow of purge gas in the lower chamber volume 136 helps prevent or reduce flow (e.g., convection and diffusion) of process gas from the upper chamber volume 134 to the lower chamber volume 136. The flow of purge gas enters the lower chamber volume 136 through one or both of a side inlet 150 formed in or around the sidewall 109 and/or a bottom inlet 151 formed in the lower window 110. The side inlet 150 is disposed at an elevation below the process gas inlet 140. A distribution channel 152 is formed radially between the lower liner 130 and the sidewall 109 and vertically between the sidewall 109 and the lower window 110. The distribution channel 152 is fluidly coupled to the side inlet 150 for receiving purge gas from the side inlet 150. The distribution channel 152 may extend 360° around the lower liner 130 to facilitate distributing purge gas evenly around the lower chamber volume 136. The distribution channel 152 is fluidly coupled to the lower chamber volume 136 through a second channel 154. The second channel 154 shown is formed between the lower liner 130 and the lower window 110. Alternatively, the second channel 154 may be formed through a body of the lower liner 130. The second channel 154 may be formed as a single annular channel or including multiple arc-shaped segments. The second channel 154 is disposed at an elevation below the process gas inlet 140. The second channel 154 shown is also disposed at an elevation below the distribution channel 152. Alternatively, the second channel 154 may be disposed at or above the distribution channel 152. The second channel 154 is configured to direct the purge gas into the lower chamber volume 136 in a generally radially inward direction as indicated by purge gas flow 172.

The upper chamber volume 134 is defined vertically above the plane of the susceptor 112 (e.g., above the substrate-receiving surface 114 thereof or above a substrate 101 disposed thereon) and the pre-heat ring 132, defined vertically below the upper window 108, and defined radially inwardly of the sidewall 109. The lower chamber volume 136 is defined vertically below the plane of the susceptor 112

(e.g., below the back side 115 thereof), defined vertically above the lower window 110, and defined radially inwardly of the lower liner 130.

In a substrate loading position, the susceptor 112 is lowered relative to the pre-heat ring 132 to provide a vertical gap between radially overlapping portions of the susceptor 112 and pre-heat ring 132. A substrate 101 is configured to be loaded into the chamber body 102 and unloaded from the chamber body 102 through the gap and through a corresponding opening in the lower liner 130. In the processing position (shown in FIG. 1A), the susceptor 112 is raised such that the susceptor 112 and the pre-heat ring 132 are disposed at an elevation between a terminus of the process gas inlet 140 and a terminus of the second channel 154.

The bottom inlet 151 is disposed between the shaft 120 and the lower window 110. The bottom inlet 151 is directly fluidly coupled to the lower chamber volume 136. The bottom inlet 151 is disposed at an elevation below the second channel 154. The bottom inlet 151 is configured to direct purge gas into the lower chamber volume 136 in a generally upward and radially outward direction as indicated by purge gas flow 174. Purge gas flow 174 from the bottom inlet 151 may be configured to increase the flow of purge gas to a bottom portion of the lower chamber volume 136 compared to purge gas flow 172 alone.

Purge gas in the lower chamber volume 136 flows to the upper chamber volume 134 between radially overlapping portions of the susceptor 112 and pre-heat ring 132. The purge gas exits the upper chamber volume 134 through the same exhaust port as the process gas (e.g., process gas outlet 142). In one or more examples, a purge gas outlet may be formed through the sidewall 109. The purge gas outlet may be located opposite the process gas inlet 140 or at any radial position along the sidewall 109 with respect to the process gas inlet 140. In such examples, a vent may be formed radially through the lower liner 130 for exhausting purge gas directly from the lower chamber volume 136 and into the purge gas outlet. In such examples, the vacuum pump 144 may be fluidly coupled to a downstream side of the purge gas outlet to facilitate exhaustion of the purge gas through the vent and the purge gas outlet. In such examples, mixing of the purge gas with the process gas in the upper chamber volume 134 may be reduced or prevented.

An example sensor assembly 160 for in situ monitoring of film growth in processing chambers is illustrated in FIG. 1A. In FIG. 1A, the pre-heat ring 132 includes a mounting aperture 133 extending in a longitudinal direction through a body of the pre-heat ring 132 and perpendicular to a plane of the pre-heat ring 132. In the implementation shown in FIG. 1A, the mounting aperture 133 is located on a gas inlet side of the pre-heat ring 132 (e.g., having a circumferential position aligned with the process gas inlet 140) such that the process gases flow over the sensor assembly 160 prior to flowing over the substrate 101. Other locations are contemplated for the mounting aperture 133 and the sensor assembly 160. The mounting aperture 133 receives a portion of the sensor assembly 160 therethrough. In one or more examples, the mounting aperture 133 is used for coupling the assembly 160 to the pre-heat ring 132. Although only one mounting aperture 133 is shown, the pre-heat ring may include multiple mounting apertures (e.g., two, three, four, five or more mounting apertures). The one or more mounting apertures may be located at any circumferential position on the pre-heat ring 132 such as on a gas outlet side of the pre-heat ring 132 (e.g., aligned with the process gas outlet 142) or towards a middle of the pre-heat ring 132 (e.g., halfway between the process gas inlet 140 and process gas outlet 142).

The sensor assembly 160 generally includes a sensor tube 161, a sensor window 162 coupled to the sensor tube 161, and a sleeve 163 disposed around a portion of the sensor tube 161 and movable (e.g., longitudinally) relative to the sensor tube 161. The sensor window 162 can be a coupon. The sensor tube 161 has an optical path 164 therein, and the sensor window 162 covers the optical path 164. The sensor tube 161, sensor window 162, and sleeve 163 are disposed within the internal volume of the processing chamber 100 and therefore may be referred to herein as an internal sub-assembly. The sensor tube 161 is disposed through the mounting aperture 133. Although only one internal sub-assembly, which includes the sensor tube 161, sensor window 162, and sleeve 163, is shown, the sensor assembly 160 may further include one or more additional internal sub-assemblies, each including a sensor tube, sensor window, and sleeve, located at circumferential positions corresponding to the one or more mounting apertures.

In FIG. 1A, the sensor window 162 is in direct contact with the pre-heat ring 132. A temperature of the pre-heat ring 132 may be about 25° C. to about 100° C. below a temperature of the sensor window 162. Therefore, direct contact between the pre-heat ring 132 and the sensor window 162 may contribute to thermal energy loss from the sensor window 162 to the pre-heat ring 132 which may undesirably lower a temperature of the sensor window 162 towards a temperature of the pre-heat ring 132. In one or more examples, a thermal insulator may be disposed between the sensor window 162 and the pre-heat ring 132 in order to reduce thermal energy loss (e.g., through conduction) from the sensor window 162 to the pre-heat ring 132 which may advantageously maintain the sensor window 162 at a higher temperature than the pre-heat ring 132. The sensor window 162 (e.g., a distal side thereof which faces towards the upper window 108) is exposed to the process gas region (e.g., the upper chamber volume 134) of the processing chamber 100. In FIG. 1A, the distal side of the sensor window 162 is parallel to a plane 139 of the pre-heat ring 132. In one or more examples, the distal side of the sensor window 162 may be disposed at an acute or obtuse angle relative to the plane 139 of the pre-heat ring 132.

In one embodiment which can be combined with other embodiments, the sensor tube 161 may be formed from silicon carbide (e.g., SiC). In one example, which can be combined with other examples, the sensor tube 161 may be is formed from sintered silicon carbide. In one or more examples, the silicon carbide of the sensor tube 161 has a fine grain SiC crystal structure. The sensor tube 161 may be formed from any suitable material which is able to block light (e.g., infrared lamp radiation) from passing through a wall of the sensor tube 161 in order to seal off the optical path 164 from optical interference from within the internal volume of the processing chamber 100. The sensor tube 161 may be formed from any suitable thermally conductive material which is able to absorb infrared radiation from the radiant heat lamps 126 (e.g., from below the lower window 110) and subsequently conduct thermal energy from the sensor tube 161 to the sensor window 162 coupled thereto in order to increase a temperature of the sensor window 162, thereby advantageously raising the temperature of the sensor window 162 towards a temperature of the susceptor 112 and/or the substrate 101 disposed thereon. In one or more examples, the sensor window 162 and the susceptor 112, and/or the substrate 101 disposed thereon, may be about the same temperature within about ±50° C. In one example, which can be combined with other examples, the temperature of the sensor window 162 may be about the same as the temperature of the susceptor 112, and/or the substrate 101 disposed thereon, during a processing operation that epitaxially grows a material on the substrate 101.

In one or more examples, a thickness of the sensor window 162 may be about 400 μm or less to advantageously reduce light attenuation therethrough. In one or more examples, the sensor window 162 may have a crystalline structure. Advantageously, the crystalline structured sensor window 162 increases light transmission and thermal conductivity relative to a corresponding amorphous material. In one embodiment, which can be combined with other embodiments, the sensor window 162 is formed from silicon carbide (e.g., SiC). Other materials are contemplated for the sensor window 162. Advantageously, the silicon carbide sensor window 162 provides a spectral transmission signal for any silicon-based doped or undoped film deposited thereon, in contrast to a sensor window formed from silicon which fails to provide a spectral transmission signal for silicon-based films. In one embodiment, which can be combined with other embodiments, the sensor window 162 is crystalline silicon carbide. The crystalline structure of the sensor window 162 is 6H, 4H, 3C, or combinations thereof. In one embodiment, which can be combined with other embodiments, the sleeve 163 is formed from silicon carbide (e.g., SiC), quartz (e.g., black quartz or opaque quartz), or combinations thereof.

The sensor assembly 160 includes or is coupled to multiple fiber optic cables 165 (165*a*-*b*) which are disposed inside tubing 166. The tubing 166 may be formed from or coated with a material for shielding the fiber optic cables 165 from high temperatures. In one embodiment, which can be combined with other embodiments, the tubing 166 includes gold plating. The fiber optic cables 165 are operable to transmit light in either direction between the optical path 164 and an optical module 167. The fiber optic cables 165 are disposed outside the internal volume (which includes upper chamber volume 134 and lower chamber volume 136) of the processing chamber 100 and therefore may be referred to herein as an external sub-assembly. In one or more examples, the fiber optic cables 165 are disposed outside the lower window 110 and are optically coupled to the optical path 164 of the sensor tube 161 through the lower window 110.

In one or more examples, the external sub-assembly, which includes at least the fiber optic cables 165, may be rotatable about an axis aligned with a radial center of the susceptor 112. When the processing chamber 100 includes multiple internal sub-assemblies at different positions, the external sub-assembly may be selectively rotated into alignment with each different internal subassembly. For example, the external sub-assembly may be rotated such that the fiber optic cables 165 are aligned with an optical path 164 of each corresponding sensor tube 161. In such examples, cycling the external sub-assembly into rotational alignment with each of the different internal sub-assemblies enables monitoring of film thickness and/or growth rate of the film deposited on each corresponding sensor window, which indicates a film thickness and/or growth rate of the film deposited at different locations on the substrate 101.

The sensor assembly 160 further includes or is coupled to the optical module 167. In FIG. 1A, the optical module 167 is disposed outside the processing chamber 100 (e.g., coupled thereto). In one or more examples, the optical module 167 is disposed within the processing chamber 100 and/or integrated therein. The optical module 167 includes a light source 168 and a light sensor 169. The optical module 167 is coupled to the controller 106. In one or more examples, the optical module 167 receives input instructions from the controller 106 for operating the sensor assembly 160. In one or more examples, the optical module 167 communicates output data to the controller 106 for downstream processing, analysis, storage, feedback control, and/or combinations thereof.

A source cable 165*a* is optically coupled to the light source 168 for generating light to be directed towards the sensor window 162 through the optical path 164. A return cable 165*b* is optically coupled to the light sensor 169 for sensing return light (e.g., light reflected from or transmitted through the sensor window 162 and directed away from the sensor window 162 through the optical path 164). In one or more examples, the source cable 165*a* and return cable 165*b* each includes one or more fiber optic cables.

In one or more examples, the light source 168 generates light at a wavelength within a range of about 300 nm to about 700 nm. In one or more examples, the light source 168 is configured to generate visible light, ultraviolet light, infrared light, broadband light, and/or combinations thereof. In one example, which can be combined with other examples, the light source 168 generates visible light at a wavelength within a range of about 500 nm to about 700 nm.

The light sensor 169 is configured to measure a light intensity of the return light received from the optical path 164. In one or more examples, the light sensor 169 includes an optical spectrometer (such as a spectrograph) configured to measure wavelength-resolved intensity. The light sensor 169 may include a grating, an optical lens, a linear-array photodiode detector, and/or combinations thereof.

Figure 1B:
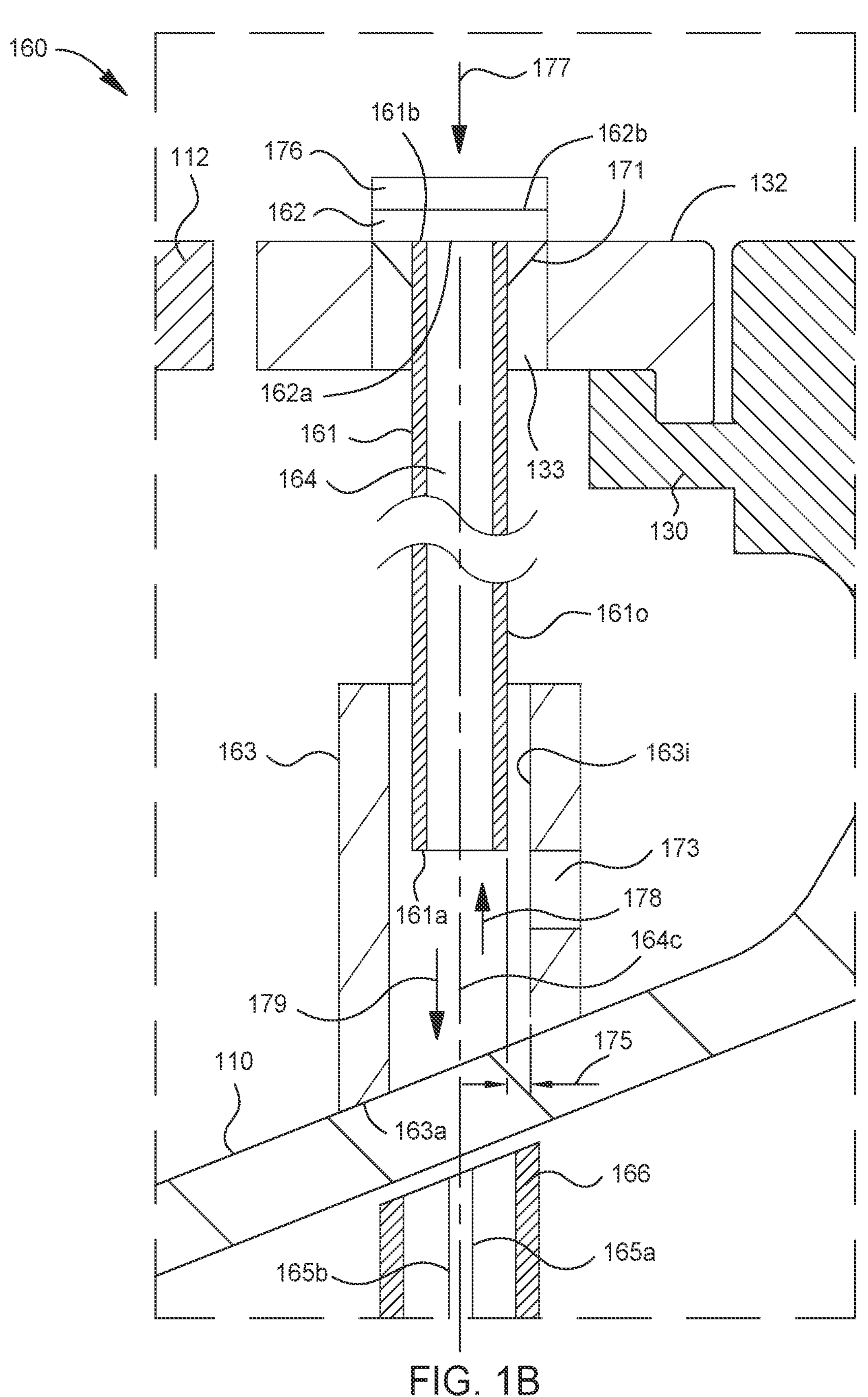
FIG. 1B is an enlarged schematic cross-sectional view of a portion of FIG. 1A illustrating an example sensor assembly, according to one implementation.

FIG. 1B is an enlarged schematic cross-sectional view of a portion of FIG. 1A illustrating the sensor assembly 160, according to one implementation. As shown in FIG. 1B, a filler material 171 is added to a joint between the sensor tube 161 and the sensor window 162. In one or more examples, the filler material 171 includes silicon carbide (e.g., SiC) or any other suitable material for fusing together opposing surfaces of the sensor tube 161 and sensor window 162. The filler material 171 is formed in the mounting aperture 133 and between the sensor tube 161 and the sensor window 162 using a formation operation (such as a chemical vapor deposition (CVD) operation) to fuse the sensor window 162 to the sensor tube 161. In one or more embodiments, the filler material 171 is formed using a CVD operation at a process temperature, and the process temperature is greater than 1,000 degrees Celsius.

The sensor tube 161 has a proximal end 161*a* and a distal end 161*b*. A center axis 164*c* of the optical path 164 extends between the proximal end 161*a* and the distal end 161*b* of the sensor tube 161. In the illustrated implementation, the sensor tube 161 is straight. The sensor tube 161 may be angled or curved. A proximal side 162*a* of the sensor window 162 is coupled to the distal end 161*b* of the sensor tube 161. The sensor window 162 encloses the distal end 161*b* of the sensor tube 161 including completely covering the optical path 164, thereby isolating the optical path 164 from the process gas flow 170. One advantage of isolating the optical path 164 is that the proximal side 162*a* of the sensor window 162 is kept clean without the use of purge gas in the optical path 164.

A distal side 162*b* of the sensor window 162 faces away from the proximal side 162*a*. The distal side 162*b* is perpendicular to the center axis 164*c* of the optical path 164. The distal side 162*b* is exposed to the process gas region (i.e., upper chamber volume 134) which is defined vertically above the plane of the susceptor 112 (e.g., above the substrate-receiving surface 114 thereof or above a substrate 101 disposed thereon) and the pre-heat ring 132 as described above. In one or more examples, a film 176 deposited on the distal side 162*b* of the sensor window 162 and the film deposited on the substrate 101 may each include silicon (Si), silicon-germanium (SiGe), silicon phosphide (SiP), silicon arsenide (SiAs), boron doped silicon-germanium (SiGeB), one or more other Group III, Group IV, or Group V elements or combinations thereof.

The film 176 deposited on the sensor window 162 simulates the film deposited on the substrate 101.

As shown in FIG. 1B, the sleeve 163 is disposed around a proximal portion of the sensor tube 161 (e.g. around the proximal end 161*a* thereof). The sensor tube 161 and sleeve 163 are movable relative to each other in a direction parallel to the center axis 164*c* of the optical path 164. In one or more examples, the sensor tube 161 is able to move longitudinally inward and outward (e.g., up and down) relative to the sleeve 163 in order to accommodate thermal expansion and contraction during heating and cooling, respectively, of the sensor tube 161 relative to the sleeve 163. A proximal end 163*a* of the sleeve 163 faces towards the lower window 110 for sealing the sleeve 163 with the lower window 110. In one or more examples, sealing between the sleeve 163 and the lower window 110 substantially prevents light from passing through. In one or more examples, the sleeve 163 is coupled to an inside of the lower window 110 at the proximal end 163*a*. The sleeve 163 acts as a thermal barrier to facilitate reducing a temperature of the lower window 110 relative to a temperature of the sensor tube 161.

The sleeve 163 has a vent 173 formed through a wall thereof for equalizing pressure inside and outside the sleeve 163. In the illustrated implementation, the vent 173 is located on an outer portion of the sleeve 163 with respect to a radial direction of the processing chamber 100 (e.g., facing away from the radiant heat lamps 126). This location advantageously reduces and/or minimizes the infrared radiation passing through the vent 173. A radial gap 175 is formed between overlapping portions of the sleeve 163 and the sensor tube 161 (i.e., between an inner surface 163*i* of the sleeve 163 and an outer surface 1610 of the sensor tube 161). In one or more examples, the gap 175 is sized to substantially prevent light from passing through. In one or more examples, the gap 175 measured in the radial direction may be about 0.005 inches or less.

During substrate processing, source light 178 from light source 168 is directed through the optical path 164 towards the proximal side 162*a* of the sensor window 162. At least a portion of the source light 178 reflects off a film 176 deposited on the distal side 162*b* of the sensor window 162 as reflected light. Also during substrate processing, incident light 177 within the upper chamber volume 134 is transmitted, sequentially, through the film 176 and through the sensor window 162 into the optical path 164 as transmitted light. Together the reflected light and transmitted light are directed through the optical path 164 towards the return cable 165*b* as return light 179. The return light 179 is measured by the light sensor 169.

The measured light intensity of the return light 179 is used to determine a film thickness and/or a growth rate of the film 176 deposited on the sensor window 162. For example, a lower light intensity may indicate a greater film thickness on the sensor window 162, and a higher light intensity may indicate a lesser film thickness on the sensor window 162, or vice versa.

A thickness of the deposited film 176 on the sensor window 162 affects the light intensity of the return light 179, such that a change in the light intensity can signal a change in the thickness of the deposited film 176 on the sensor window 162. In one or more examples, a measurement spectra of the return light 179 may be filtered to provide values indicating measured light intensity only within a selected wavelength range. In one or more examples, an optical filter may be used to block a portion of the return light 179 which falls outside the selected wavelength range. In one or more examples, the selected wavelength range may exclude infrared light in order to reduce the effect of background infrared lamp radiation. In one or more examples, the selected wavelength range may align with a wavelength range generated by the light source 168 (e.g., visible light at a wavelength within a range of about 500 nm to about 700 nm). In some examples, the selected wavelength range may align with a wavelength range which is characteristic of the incident light 177 within the upper chamber volume 134 (e.g., a non-infrared portion thereof).

The sensor assembly 160 may be used to monitor film growth rate in situ in the processing chamber 100 and in real-time during substrate processing. In one example, which can be combined with other examples, the light intensity of the return light 179 is monitored continuously throughout substrate processing. Sensor assembly embodiments disclosed herein reduce interference from infrared lamp radiation which increases a signal-to-noise ratio of the light sensor 169 for more accurate film growth measurements.

Figure 1C:
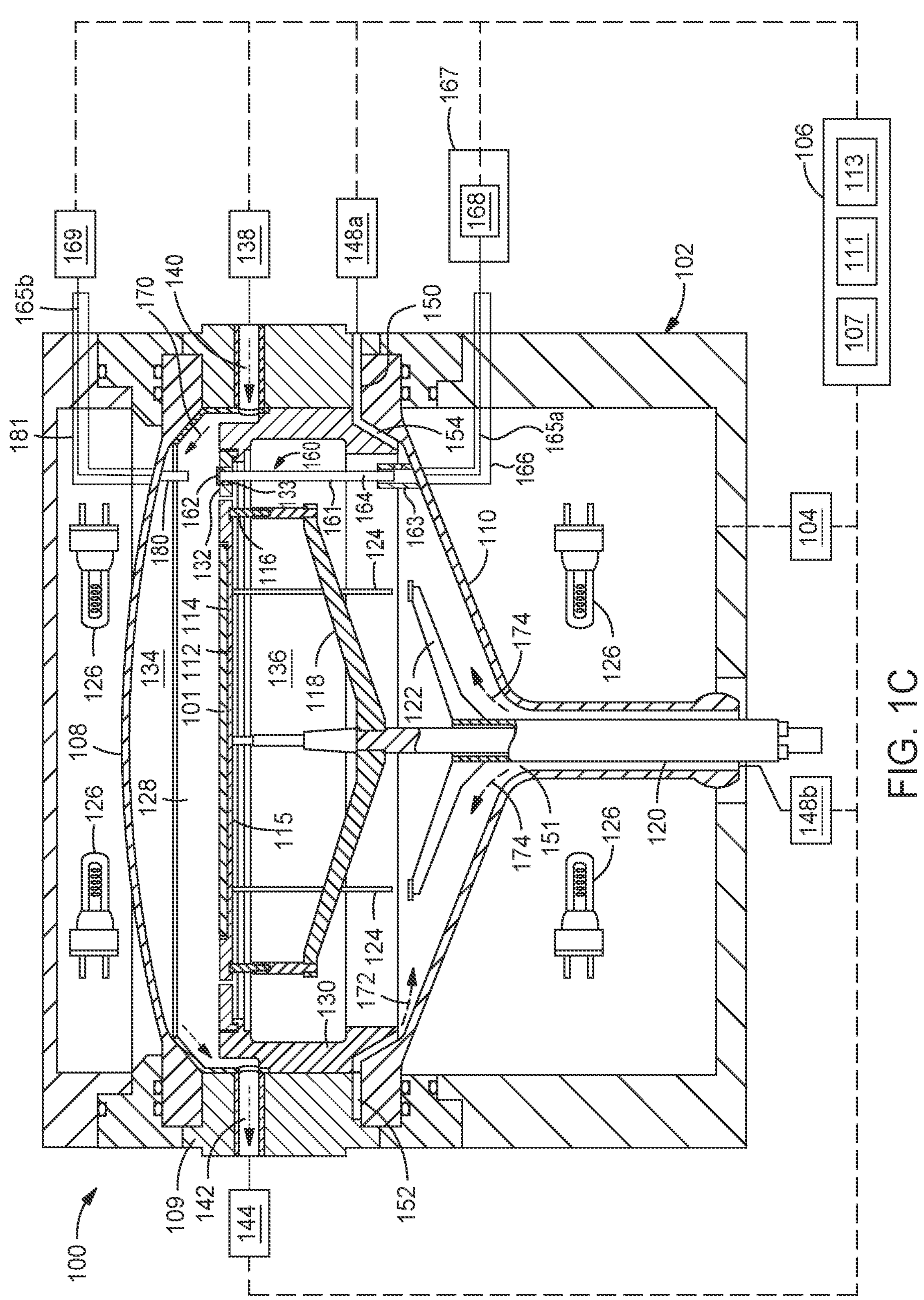
FIG. 1C is a schematic cross-sectional side view of the processing chamber of FIG. 1A illustrating an arrangement of the sensor assembly, according to one implementation.

FIG. 1C is a schematic cross-sectional side view of the processing chamber 100 of FIG. 1A illustrating an arrangement of the sensor assembly 160, according to one implementation. In FIG. 1C, a sensor tube 180, which is similar to the sensor tube 161, is disposed within the upper chamber volume 134 of the processing chamber 100. The sensor tube 180 may be formed from a material which is able to block light (e.g., infrared lamp radiation) from passing through a wall of the sensor tube 180 in order to seal off an optical path therein from optical interference from within the internal volume of the processing chamber 100. In one or more examples, the sensor tube 180 has a reflective coating on an outside thereof. In one embodiment, which can be combined with other embodiments, the sensor tube 180 is formed from silicon carbide (e.g., SiC). In one example, which can be combined with other examples, the sensor tube 180 is sintered silicon carbide. In one or more examples, the sensor tube 180 may have an amorphous or polysilicon structure. The sensor tube 180 is coupled to the upper window 108. In one or more examples, the sensor tube 180 may be directly fused to the upper window 108. The sensor tube 180 is located above the sensor window 162 and aligned therewith on the center axis 164*c* of the optical path 164 (shown in FIG. 1B).

In FIG. 1C, the return cable 165*b* and light sensor 169 are located apart from the light source 168 and source cable 165*a*. The return cable 165*b* is disposed inside tubing 181, which is similar to the tubing 166 described above. In one example, which can be combined with other examples, the light sensor 169 is arranged for making light intensity measurements in transmission mode only. The return cable 165*b* is aligned with the optical path 164 for receiving light transmitted through the sensor tube 161, through the sensor window 162, through a film disposed on the sensor window 162, and through the sensor tube 180. In one or more examples, the light source 168 is a laser or lamp source capable of producing a single wavelength or a range of wavelengths. The measured light intensity at the light sensor 169 is used to determine a film thickness and/or a growth rate of the film deposited on the sensor window 162 as described above.

Figure 2A:
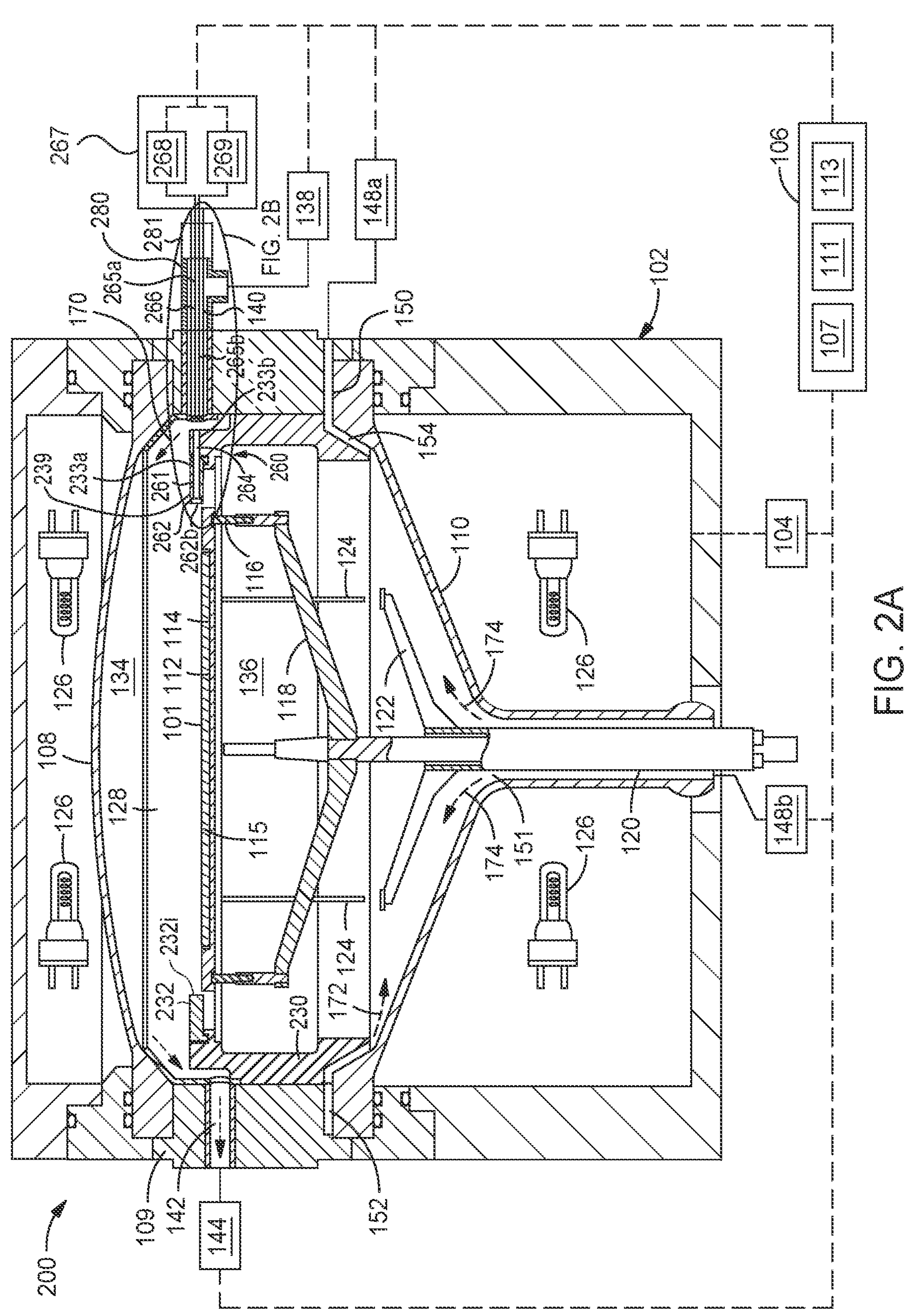
FIG. 2A is a schematic cross-sectional side view of a processing chamber illustrating an example sensor assembly, according to one implementation.
Figure 2B:
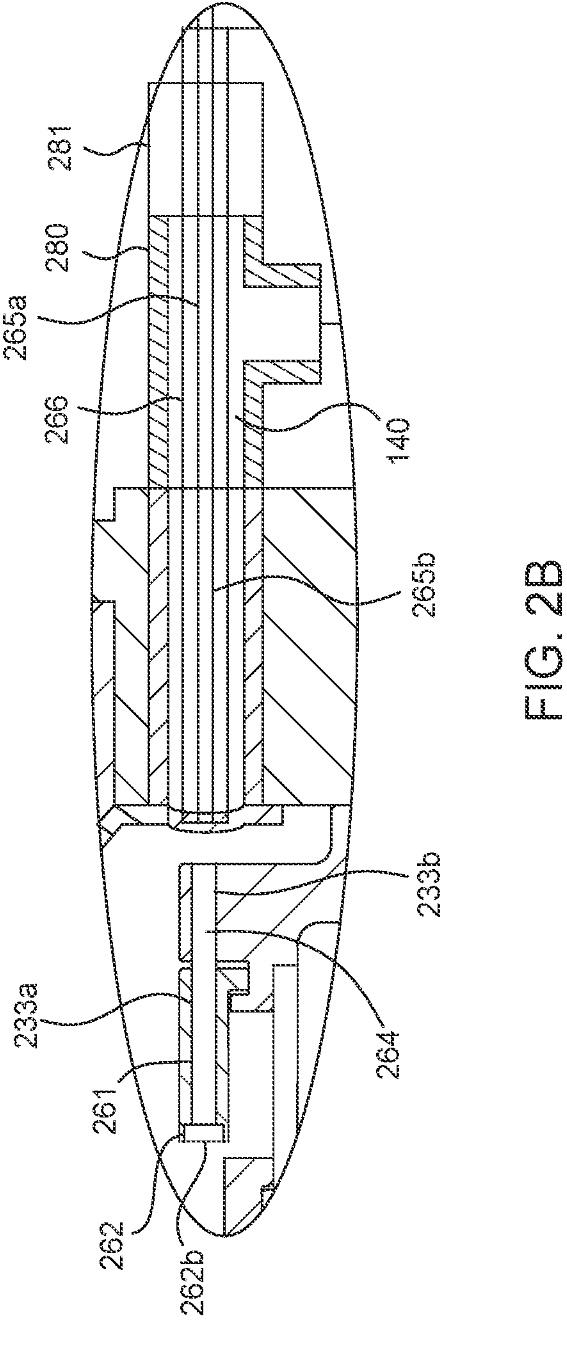
FIG. 2B is an enlarged schematic cross-sectional view of a portion of FIG. 2A illustrating the example sensor assembly, according to one implementation

FIG. 2A is a schematic cross-sectional view of a processing chamber 200 illustrating an example sensor assembly 260, according to one implementation. FIG. 2B is an enlarged schematic cross-sectional view of a portion of FIG. 2A illustrating the sensor assembly 260, according to one implementation. FIGS. 2A-2B are described together herein for clarity. Features of the sensor assembly 260 may be the same as corresponding features of the sensor assembly 160 of FIGS. 1A-1B unless otherwise noted. Therefore, structures and corresponding labels for identical features are retained from FIGS. 1A-1B.

In FIGS. 2A-2B, a pre-heat ring 232 includes a mounting aperture 233*a* extending in a longitudinal direction parallel to a plane 239 of the pre-heat ring 232. The sensor assembly 260 generally includes a sensor tube 261 and a sensor window 262 coupled to the sensor tube 261. The sensor tube 261 has an optical path 264 therein, and the sensor window 262 covers the optical path 264. The sensor tube 261 and sensor window 262 are disposed in the mounting aperture 233*a* formed through a body of the pre-heat ring 232 and through a corresponding aperture 233*b* formed through a body of a liner 230. In some examples, in order for the sensor tube 261 to fit inside the pre-heat ring 232 in the orientation shown in FIGS. 2A-2B, the sensor tube 261 may have an outer diameter of about 4 mm or less.

In FIGS. 2A-2B, the sensor window 262 is recessed inside the pre-heat ring 232 relative to an inner radial edge 232*i* thereof. In one or more examples, the sensor window 262 is flush with the inner radial edge 232*i* or disposed outside the inner radial edge 232*i*. In one or more examples, a thermal insulator may be disposed between the sensor window 262 and the pre-heat ring 232. In one or more examples, the sensor tube 261 and sensor window 262 may be coupled to another component of the processing chamber 200 separate from the pre-heat ring 232 and liner 230 (e.g., the sidewall 109, the upper liner 128, or any other suitable component).

The sensor window 262 (e.g., a distal side 262*b* thereof which faces towards a center of the processing chamber 200) is exposed to the process gas region (e.g., upper chamber volume 134) of the processing chamber 200 for receiving film deposition thereon which simulates film deposition on the substrate 101. In one or more implementations (e.g., shown in FIG. 1A) during processing, the susceptor and pre-heat ring may be disposed at about the same elevation (e.g., having coplanar uppermost surfaces). However, in FIGS. 2A-2B, the susceptor 112 is lowered in elevation relative to the pre-heat ring 232 in order prevent radial overlap between the sensor window 262 and the pre-heat ring 232 which would otherwise reduce or prevent film deposition on the sensor window 262. In one or more examples, the uppermost surface of the susceptor 112 may be lowered by a distance of about 1 mm or more, such as about 1 mm to about 5 mm, such as about 2 mm, relative to the uppermost surface of the pre-heat ring 232. In FIGS. 2A-2B, the distal side 262*b* of the sensor window 262 is perpendicular to the plane 239 of the pre-heat ring 232. Far more infrared lamp radiation is directed in the perpendicular direction compared to being directed parallel to the plane of the pre-heat ring 232. Therefore, orienting the sensor window 262 perpendicular to the plane 239 of the pre-heat ring 232 reduces the amount of infrared radiation transmitted from the internal volume of the processing chamber 200 into the optical path 264. Therefore, blockage of infrared lamp radiation resulting from materials and architecture of the sensor tube 261 and sensor window 262 is further improved by the orientation of the sensor assembly 260 illustrated in FIGS. 2A-2B. In one or more examples, the distal side 262*b* of the sensor window 262 may be disposed at an acute or obtuse angle from perpendicular relative to the plane 239 of the pre-heat ring 232.

The sensor assembly 260 includes or is coupled to multiple fiber optic cables 265 (265*a*-*b*) which are disposed inside tubing 266. The fiber optic cables 265 are operable to transmit light in either direction between the optical path 264 and an optical module 267 including a light source 268 and a light sensor 269. The fiber optic cables 265 are disposed at least partially through the process gas inlet 140 and are optically coupled to the optical path 264 of the sensor tube 261 which is aligned with the process gas inlet 140. A T-connector 280 is coupled to the sidewall 109 and is in fluid communication between the process gas source 138 and the process gas inlet 140. The fiber optic cables 265 are disposed through a straight path of the T-connector 280. Exposure of the tubing 266 around the fiber optic cables 265 to process gas flow 170 in the T-connector 280 may advantageously provide cooling to the fiber optic cables 265.

A fiber optic feedthrough 281 is coupled to the T-connector 280 for passing the fiber optic cables 265 from the optical module 267 to the T-connector 280. The fiber optic feedthrough 281 provides a vacuum seal around the fiber optic cables 265 to prevent gas from leaking into the processing chamber (e.g., during substrate processing at reduced pressure).

Figure 3:
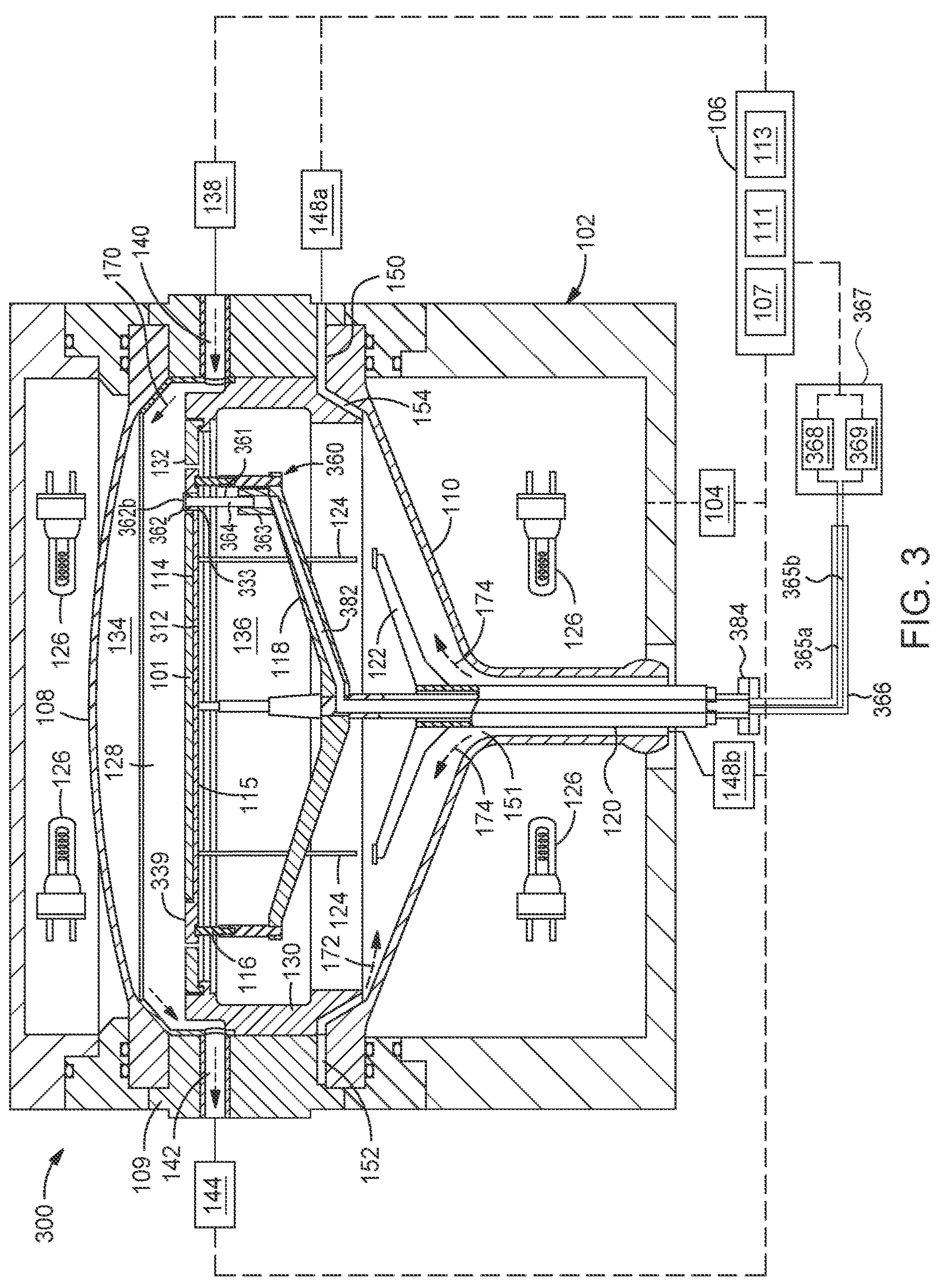
FIG. 3 is a schematic cross-sectional side view of a processing chamber illustrating an example sensor assembly, according to one implementation.

FIG. 3 is a schematic cross-sectional side view of a processing chamber 300 illustrating an example sensor assembly 360, according to one implementation. Features of the sensor assembly 360 may be the same as corresponding features of the sensor assembly 160 of FIGS. 1A-1B unless otherwise noted. Therefore, structures and corresponding labels for identical features are retained from FIG. 1A. In FIG. 3, the sensor assembly 360 is coupled to a susceptor 312 instead of the pre-heat ring 132, as described below.

In FIG. 3, a susceptor 312 includes a mounting aperture 333 extending in a longitudinal direction perpendicular to a plane 339 of the susceptor 312. The sensor assembly 360 generally includes a sensor tube 361, a sensor window 362 coupled to the sensor tube 361, and a sleeve 363 disposed around a portion of the sensor tube 361 and movable (e.g., longitudinally) relative to the sensor tube 361. The sensor tube 361 has an optical path 364 therein, and the sensor window 362 covers the optical path 364. The sensor tube 361, sensor window 362, and sleeve 363 are disposed within the internal volume of the processing chamber 300. The sensor tube 361 is disposed through a body of the susceptor 312. The sensor window 362 is in direct contact with the susceptor 312. Direct contact between the sensor window 362 and the susceptor 312 is advantageous for equalizing a temperature of the sensor window 362 with a temperature of the susceptor 312 through conductive heat transfer therebetween. Another advantage of coupling the sensor assembly 360 to the susceptor is that with low speed rotation of the susceptor 312, film deposition can be mapped out over the full 360° around the substrate 101.

The sensor window 362 (e.g., a distal side 362*b* thereof which faces towards the upper window 108) is exposed to the process gas region (e.g., the upper chamber volume 134) of the processing chamber 300 for receiving film deposition thereon which simulates film deposition on the substrate 101. With the sensor window 362 positioned on the susceptor 312 (which is located closer to the substrate 101 and also has a temperature closer to that of the substrate 101), film deposition on the sensor window 362 more accurately simulates film deposition on the substrate 101 compared to sensor assembly embodiments in which the sensor window is disposed on the pre-heat ring as described above. In FIG. 3, the distal side 362*b* of the sensor window 362 is parallel to the plane 339 of the susceptor 312. In one or more examples, the distal side 362*b* of the sensor window 362 is disposed at an acute or obtuse angle relative to the plane 339 of the susceptor 312.

The sensor assembly 360 includes or is coupled to multiple fiber optic cables 365 (365*a-b*) which are disposed inside tubing 366. The fiber optic cables 365 are operable to transmit light in either direction between the optical path 364 and an optical module 367 including a light source 368 and a light sensor 369. In FIG. 3, an intermediate optical path 382 is formed in a body of the supporting arm 118 and in a body of the shaft 120. Thus, the fiber optic cables 365 are optically coupled to the optical path 364 of the sensor tube 361 at least partially through the intermediate optical path 382. Because the shaft 120 is rotatable relative to the fiber optic cables 365, a rotatable coupling 384 is disposed at a proximal end of the shaft 120 for coupling the fiber optic cables 365 to the intermediate optical path 382. In the example illustrated in FIG. 3, the rotatable coupling 384 is an optical coupling. In one or more examples, instead of the intermediate optical path 382, the fiber optic cables 365 extends through the supporting arm 118 and shaft 120 to directly optically couple to the optical path 364 of the sensor tube 361. In one or more examples, the rotatable coupling may be a rotatable fiber optic feedthrough assembly.

Figure 4:
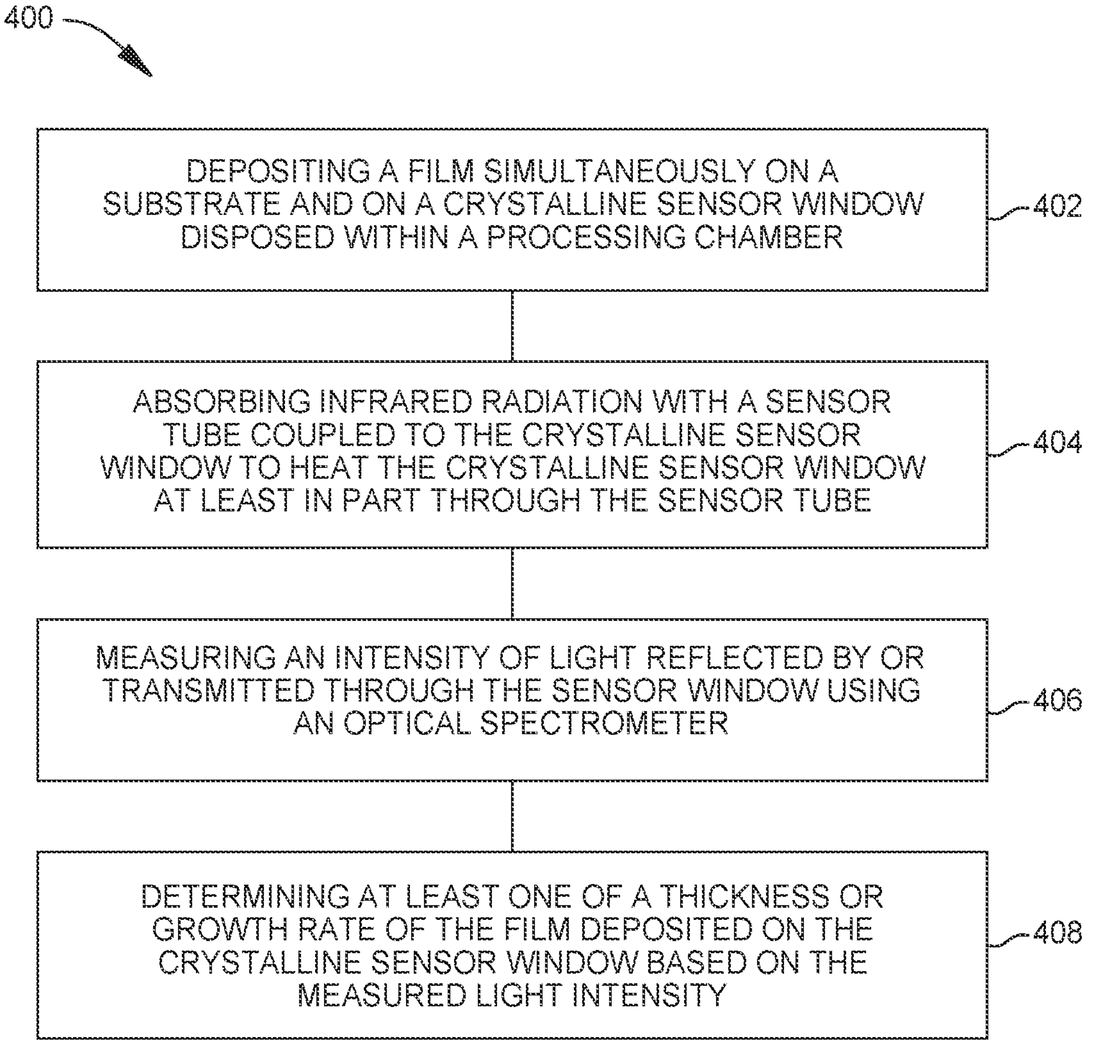
FIG. 4 is a schematic diagram view illustrating a method of processing a substrate, according to one implementation.

FIG. 4 is a schematic diagram view illustrating a method 400 of processing a substrate, according to one implementation. In one or more examples, the method 400 may be implemented using one of the example processing chambers and/or sensor assemblies disclosed herein. In one or more examples, the method 400 may be in the form of instructions stored on a computer readable medium (e.g., memory 111), that, when executed by a processor of a system (e.g., CPU 107), cause the system to implement the method 400.

At activity 402, a film is simultaneously deposited on a substrate and on a crystalline sensor window disposed within a processing chamber. At activity 404, infrared radiation is absorbed with a sensor tube coupled to the crystalline sensor window to heat the crystalline sensor window at least in part through the sensor tube. In one embodiment, which can be combined with other embodiments, heating the crystalline sensor window at least in part through the sensor tube includes conducting heat from the sensor tube to the crystalline sensor window.

At activity 406, an intensity of light reflected by or transmitted through the sensor window is measured using an optical spectrometer.

At activity 408, at least one of a thickness or growth rate of the film deposited on the crystalline sensor window is determined based on the measured light intensity. In one embodiment, which can be combined with other embodiments, the determining of the thickness and/or the growth rate includes measuring a plurality of light intensity values of the light (which can include transmitted light and/or reflected light) across one or more time intervals. The plurality of light intensity values are correlated to reference data or physical models based on Fresnel's equations of electromagnetic wave reflection to determine the growth rate across one or more time intervals. The growth rate and/or the thickness (such as a thickness change) can correspond to a change in light intensity across the one or more time intervals. In one or more examples, a film thickness can be determined using the growth rate at a certain time interval.

In one embodiment, which can be combined with other embodiments, the crystalline sensor window is positioned on a susceptor disposed within the processing chamber and configured to support a substrate thereon (e.g., processing chamber 300 shown in FIG. 3). In such an embodiment, the method may further include rotating the susceptor during film deposition and creating a 360° map of at least one of a thickness and/or growth rate of the film deposited on the substrate based on a corresponding determination of thickness and/or growth rate of the film deposited on the crystalline sensor window. In such an embodiment, the determination may be based on light intensity measurements at different degrees of rotation of the susceptor.

In one embodiment, which can be combined with other embodiments, a map of at least one of a thickness and/or growth rate of the film deposited on a substrate is created based on a corresponding determination of thickness and/or growth rate of the film deposited on a plurality of crystalline sensor windows. The crystalline sensor windows are supported on a plurality of sensor assemblies that are spaced from each other circumferentially about the substrate. The sensor assembles can be mounted to a pre-hear ring using a plurality of mounting apertures spaced from each other circumferentially about the substrate.

The present disclosure contemplates that the activities 402-408 of the method 400 can be repeated. In one embodiment, which can be combined with other embodiments, the activities 402-408 are repeated for a second substrate after the substrate is removed from the internal volume of the processing chamber and the second substrate is transferred into the internal volume. The present disclosure contemplates that the same sensor assembly having the same sensor window can be used for processing of the second substrate, or the sensor window can be replaced with a second sensor window for processing of the second substrate.

Benefits of the present disclosure include in-situ and real-time film thickness measurement operations, accurate film growth monitoring, increased signal-to-ratios, reduced interferences of light with measurements, increased measurement resolutions, increased efficiency and throughput, reduced machine downtime, and reduced costs.

It is contemplated that one or more aspects disclosed herein may be combined. As an example, one or more aspects, features, components, and/or properties of the processing chamber 100, the sensor assembly 160, the processing chamber 200, the sensor assembly 260, the processing chamber 300, and/or the method 400 may be combined. Moreover, it is contemplated that one or more aspects disclosed herein may include some or all of the aforementioned benefits.

The present disclosure achieves unexpected results as it has been thought that measuring film growth in the internal volume of a processing chamber would involve inaccuracies resulting from the use of upper and lower domes and/or light irradiated from lamps for heating the substrate. The present disclosure achieves the aforementioned benefits over operations that conduct on-substrate film measurements after the substrate is processed and removed from the process chamber.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

What is claimed is:

1. A processing chamber suitable for use in semiconductor manufacturing, comprising:

a susceptor; and a sensor assembly, comprising:

a sensor tube comprising silicon carbide and having an optical path therein, the sensor tube disposed through a body of a pre-heat ring disposed outwardly of the susceptor;

a sensor window comprising crystalline silicon carbide and having a proximal side coupled to a distal end of the sensor tube, wherein the sensor window covers the optical path, and wherein a distal side of the sensor window facing away from the proximal side is perpendicular to a center axis of the optical path;

a sleeve disposed around a proximal end of the sensor tube, the sleeve comprising a vent formed in a wall of the sleeve, the vent including an opening extending from an outer surface of the wall and to an inner surface of the wall; and one or more fiber optic cables disposed in tubing, the one or more fiber optic cables operable to transmit light.

2. The processing chamber of claim 1, wherein the sensor tube comprises sintered silicon carbide.

3. The processing chamber of claim 1, wherein the crystalline silicon carbide of the sensor window comprises at least one of a 6H, 4H, or 3C crystalline structure.

4. The processing chamber of claim 1, wherein the sleeve comprises at least one of silicon carbide, black quartz, or opaque quartz.

5. The processing chamber of claim 1, wherein the sensor tube and the sleeve are movable relative to each other in a direction parallel to the center axis of the optical path.

6. The processing chamber of claim 5, further comprising a radial gap disposed between overlapping portions of the sensor tube and sleeve.

7. The processing chamber of claim 1, wherein a joint couples the sensor window to the sensor tube, and the joint has a filler material.

8. The processing chamber of claim 7, wherein the filler material comprises silicon carbide.

9. The processing chamber of claim 1, wherein the vent includes an opening formed below the proximal end of the sensor tube.

10. The processing chamber of claim 1, wherein:

the sensor tube extends into a distal end of the sleeve; and the one or more fiber optic cables are positioned at a spacing from the sleeve.

11. The processing chamber of claim 1, wherein the one or more fiber optic cables are disposed outside of the sensor tube and the sleeve.

12. A processing chamber suitable for use in semiconductor manufacturing, comprising:

a chamber body, comprising:

an upper window, a lower window, and a side wall defining a processing region;

a process gas inlet formed through the side wall;

a susceptor disposed in the processing region and having a substrate-receiving top surface;

a pre-heat ring surrounding the susceptor;

a rotatable shaft supporting the susceptor; and a sensor assembly, comprising:

a sensor tube comprising silicon carbide and having an optical path therein, the sensor tube disposed through a body of the pre-heat ring; and a sensor window comprising crystalline silicon carbide and having a proximal side coupled to a distal end of the sensor tube, wherein the sensor window covers the optical path, and wherein a distal side of the sensor window facing away from the proximal side is perpendicular to a center axis of the optical path;

a sleeve disposed around a proximal end of the sensor tube, the sensor tube extending into a distal end of the sleeve, the sleeve comprising a vent formed in a wall of the sleeve, the vent including an opening extending from an outer surface of the wall and to an inner surface of the wall, and the sleeve and the sensor tube disposed between the lower window and the upper window of the chamber body; and one or more fiber optic cables disposed in tubing, the one or more fiber optic cables operable to transmit light, and the tubing and the one or more fiber optic cables disposed outside of the lower window.

13. The processing chamber of claim 12, wherein a proximal end of the sleeve is coupled to an inside of the lower window.

14. The processing chamber of claim 12, wherein the distal side of the sensor window is parallel to a plane of the pre-heat ring.

15. The processing chamber of claim 12, wherein the one or more fiber optic cables are optically coupled to the optical path of the sensor tube.

16. The processing chamber of claim 12, wherein the sensor tube and the sleeve are movable relative to each other in a direction parallel to the center axis of the optical path.

17. The processing chamber of claim 16, further comprising a radial gap disposed between overlapping portions of the sensor tube and sleeve.

* * * * *